United States Patent
Kobayashi et al.

(10) Patent No.: US 7,906,778 B2
(45) Date of Patent: Mar. 15, 2011

(54) METHODS OF MAKING NANO-SCALE STRUCTURES HAVING CONTROLLED SIZE, NANOWIRE STRUCTURES AND METHODS OF MAKING THE NANOWIRE STRUCTURES

(75) Inventors: Nobuhiko Kobayashi, Sunnyvale, CA (US); Wei Wu, Mountain View, CA (US); Duncan R Stewart, Menlo Park, CA (US); Shashank Sharma, San Jose, CA (US); Shih-Yuan Wang, Palo Alto, CA (US); R Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 778 days.

(21) Appl. No.: 11/730,486

(22) Filed: Apr. 2, 2007

(65) Prior Publication Data
US 2008/0237568 A1 Oct. 2, 2008

(51) Int. Cl.
*H01L 29/06* (2006.01)
(52) U.S. Cl. .......... 257/51; 257/53; 257/64; 257/65; 257/E21.09; 257/E31.038; 438/478; 977/762; 977/814
(58) Field of Classification Search .......... 257/49, 257/51–53, 64, 65, 431, E31.011, E31.012, 257/E31.038, E31.04, 458, E21.09, E21.019, 257/E21.02, E31.023, E21.024, E31.043–E31.049; 977/762, 814, 891, 932, 815; 438/478
See application file for complete search history.

(56) References Cited

U.S. PATENT DOCUMENTS

| 6,897,098 | B2 | 5/2005 | Hareland et al. | |
|---|---|---|---|---|
| 7,083,104 | B1 | 8/2006 | Empedocles et al. | |
| 7,754,600 | B2* | 7/2010 | Kobayashi et al. | 438/630 |
| 2005/0026333 | A1* | 2/2005 | Hareland et al. | 438/128 |
| 2005/0133476 | A1 | 6/2005 | Islam et al. | |
| 2006/0019472 | A1* | 1/2006 | Pan et al. | 438/486 |
| 2006/0255481 | A1 | 11/2006 | Pan et al. | |
| 2007/0267625 | A1* | 11/2007 | Wang et al. | 257/14 |

OTHER PUBLICATIONS

T. Kamins, "Beyond CMOS Electronics: Self-Assembled Nanostructures," The Electrochemical Society *Interface*, Spring 2005, pp. 46-49.
M. Saif Islam, S. Sharma, T.I. Kamins and R. Stanley Williams, "Ultrahigh-Density Silicon Nanobridges Formed Between Two Vertical Silicon Surfaces," *Nanotechnology* 15, L5-L8 (2004).
T.I. Kamins, X. Li and R. Stanley Williams, "Growth and Structure of Chemically Vapor Deposited Ge Nanowires on Substrates," *Nano Letters*, vol. 4, No. 3, pp. 503-506 (2004).
W.R. Runyan and K.E. Bean, *Semiconductor Integrated Circuit Processing Technology*, Addison-Wesley, pp. 57-58 (1994).

(Continued)

*Primary Examiner* — Anh Phung
*Assistant Examiner* — Michael Lulis (57) ABSTRACT

Methods of making nanometer-scale semiconductor structures with controlled size are disclosed. Semiconductor structures that include one or more nanowires are also disclosed. The nanowires can include a passivation layer or have a hollow tube structure.

12 Claims, 5 Drawing Sheets

OTHER PUBLICATIONS

S. Sharma, T.I. Kamins and R. Stanley Williams, "Diameter Control of Ti-Catalyzed Silicon Nanowires," *J. Cryst. Growth*, 267, pp. 613-618 (2004).

Sung Soo Yi, G. Girolami, Jun Amano, M. Saif Islam, T.I. Kamins, and S. Sharma, "InP Nanobridges Epitaxially Formed Between Two Vertical Si Surfaces", unpublished.

Ted Kamins, "Metal-catalyzed silicon nanawires: Growth and device", presented at Stanford University, Apr. 13, 2006.

Kang-ill Seo, Shashank Sharma, Amir A. Yasseri, Duncan R. Stewart, and Theodore I. Kamins, "Surface Charge Density of Unpassivated and Passivated Metal-Catalyzed Silicon Nanowires," Electrochemical and Solid-State Letters, 9 (3) G69-G72 (2006).

PCT International Search Report for Application No. PCT/US2008/004423, (Apr. 2, 2008); ISR issued Jun. 30, 2009.

* cited by examiner

METHODS OF MAKING NANO-SCALE STRUCTURES HAVING CONTROLLED SIZE, NANOWIRE STRUCTURES AND METHODS OF MAKING THE NANOWIRE STRUCTURES

BACKGROUND

Semiconductor nanometer-scaled structures can confine the motion of carriers in one direction (quantum wells), two directions (quantum wires), or three directions (quantum dots). Bottom-up fabrication techniques are being considered that use a physical or chemical mechanism to make very small features. However, the sizes of features formed by such techniques are less predictable than features formed by top-down techniques. Accordingly, it would be desirable to address this issue.

SUMMARY

An exemplary embodiment of a method of making a nano-scale structure having a controlled size comprises growing at least one nano-scale structure comprising a semiconductor material, the nano-scale structure having a dimension, $D_i$; and growing a passivation layer on the nano-scale structure by thermal oxidation, wherein growth of the passivation layer reduces the dimension of the nano-scale structure to $D_f$; wherein the thermal oxidation is controlled to control $D_f$.

An exemplary embodiment of a nanowire structure comprises a first non-single crystal surface; and at least one nanowire grown from the first non-single crystal surface, the nanowire comprising: a core comprising a semiconductor material; and at least one passivation layer formed on the core.

Another exemplary embodiment of a nanowire structure comprises a first surface; and at least one nanowire grown from the first surface, the nanowire comprising: a core comprising a semiconductor material, the core having a diameter of less than about 10 nm and a length of at least about 1000 nm; and an optional passivation layer formed on the core.

DETAILED DESCRIPTION

Methods of making nanometer-scale ("nano-scale") structures having controlled size, nanowire structures, and methods of making the nanowire structures are provided.

The methods of making nano-scale structures allow control of the size of the nano-scale structures in a process that is separated from the process used to form the nano-scale structures, e.g., a nanowire growth process. For example, the nano-scale structure growth process can be performed in one chamber, and the size control process can be performed in another chamber of the same apparatus, or in another apparatus. In embodiments of the methods, a nano-scale structure having a relatively large size can be processed to reduce the size (i.e., at least one dimension) of the structure to a desired size. For example, the nano-scale structure can have an original dimension that is reduced by a factor of up to about 10 or more. By changing the size of the nano-scale structures, selected properties of the structures can also be controlled. Size changes of the nano-scale structures can be monitored by monitoring one or more characteristic physical properties of the structures to allow these physical properties to be tuned to desirable values. The one or more physical properties that are modified can be selected for a specific application of the nano-scale structures.

By adjusting the size and one or more associated properties of the nano-scale structures after the structures have been formed, typically by bottom-up techniques, the need to adjust physical properties of the nano-scale structures associated with their size during the formation of the structures can be obviated. Thus, the methods can avoid certain difficulties associates with monitoring one or more physical properties of a nano-scale structure during formation of the structure. For example, nano-scale structure formation processes generally require high temperatures and reactive chemical environments. It is difficult to monitor nano-scale structure formation processes in such environments. In contrast, embodiments of the methods described herein allow post-tuning of one or more physical properties of an as-formed nano-scale structure by adjusting the size of the structure in a post-formation process, preferably by directly monitoring the physical property to be adjusted.

The methods of making nano-scale structures having a controlled size comprise growing a thermal oxide on a nano-scale structure comprising a semiconductor material. The semiconductor structures can be, for example, nanowires or quantum dots. Nanowires can confine the motion of carriers in two spatial directions and allow free propagation in the third direction. Quantum dots can confine carrier motion in all three spatial directions. Techniques for forming nanowires are described below. Quantum dots can be formed by various techniques including, for example, by self-assembly using molecular beam epitaxy or metalorganic vapor phase epitaxy, or by colloidal formation (e.g., semiconductor nanocrystals). The quantum dots can be hemispherical or spherical shaped. Growth of the thermal oxide reduces one or more dimensions of the nano-scale structures. The thermal oxide growth process is controlled to control the thermal oxide thickness and the size of the nano-scale structure.

The thermal oxide also forms a passivation layer on unstable surfaces of nano-scale structures. Depending on the composition of the nanowire on which the passivation layer is formed, the thermal oxide can comprise an oxide of Si, Ge, Si—Ge alloy, or aluminum oxide, for example. Silicon forms a stable and tenacious oxide in an oxidizing ambient at elevated temperatures. The oxide is chemically stable at high temperatures. Germanium oxide, $GeO_2$, is thermally stable up to lower temperatures than $SiO_2$. Surface recombination is one of the major factors that contribute to reducing the number of excess carriers produced by optical generation in photodetectors and optical sources. The passivation layer provides bond termination at nanowire surface and is effective to reduce the rate of electron-hole pair recombination at the surface of the nanowire. Photodetectors comprising the nanowires having one or more passivation layers can operate with a reduced rate of elimination of excess carriers generated by surface recombination processes. Consequently, due to the reduced surface recombination in the nanowires, there are more excess carriers available for electrical conduction in the photodetectors.

Figure 1A:
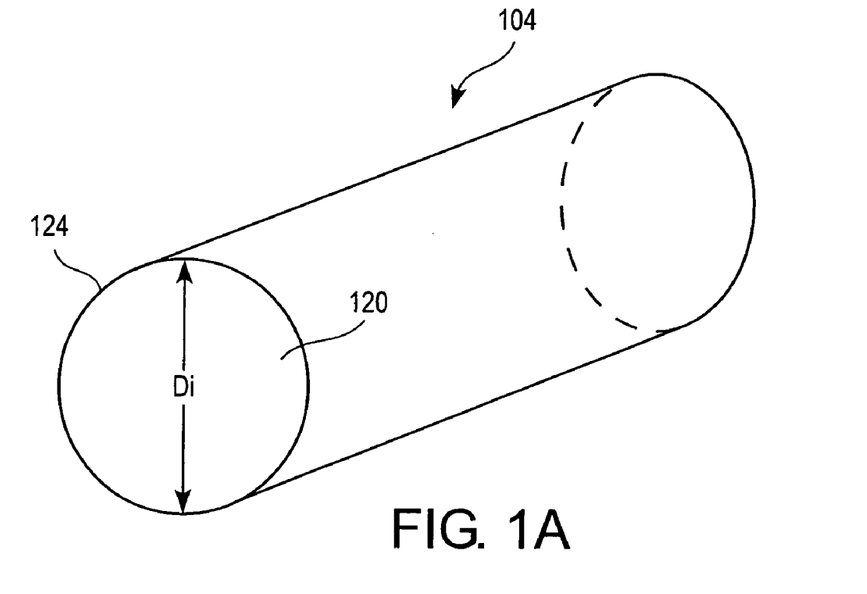
FIG. 1A illustrates a nanowire having an initial diameter, $D_i$, before growing a passivation layer on the nanowire.

FIG. 1A depicts an exemplary embodiment of a nano-scale structure in the form of a nanowire 104. The nanowire 104 is also described herein as a core 120 when a thermal oxide (passivation layer) is formed on the nanowire. The nanowire 104 includes an outer surface 124 defining a diameter, $D_i$, of the nanowire prior to thermal oxidation. The nanowire 104 can be made of any suitable semiconductor material on which a thermal oxide can be grown. For example, the nanowire 104 can comprise Si, Ge, Si—Ge alloys, or Group III-V alloys containing a sufficient mole fraction of aluminum to form aluminum oxide on the nanowire (e.g., at least about 0.3). For example, the Group III-V alloy can be AlAs, AlGaAs or AlP.

A multi-layered coating structure can be formed on the nanowires by, for example, thermally oxidizing the outer surface of the nanowire, and then forming a coating on the surface of the thermal oxide by a deposition process, such as plasma-enhanced CVD (PECVD).

Figure 1B:
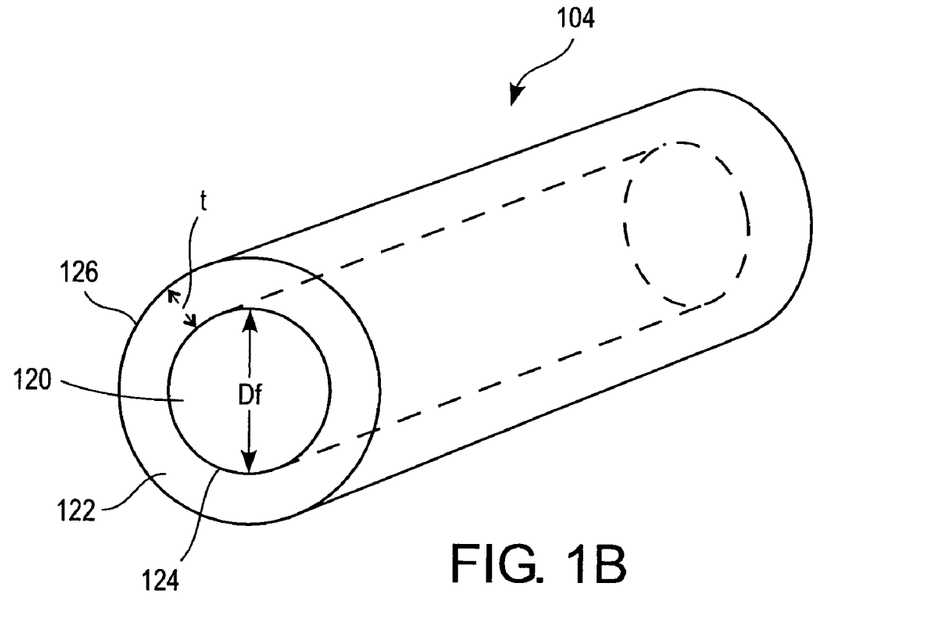
FIG. 1B illustrates the nanowire of FIG. 1A after growing a passivation layer on the nanowire, where the nanowire has a final diameter, $D_f$, which is smaller than $D_i$.

FIG. 1B illustrates the nanowire 104 of FIG. 1A after growing a passivation layer 122 having an outer surface 126 by thermal oxidation on the outer surface 124 of the core 120. As shown, the core 120 has a final diameter, $D_f$, which is smaller than $D_i$ by an amount $\Delta D$, i.e., $D_f = D_i - \Delta D$. The final diameter, $D_f$, of the nanowire 104 can be controlled by controlling the thickness, t, of the thermal oxide during the thermal oxidation process. The thickness of the thermal oxide can be controlled by controlling the thermal oxidation process parameters, including the oxidation temperature, pressure, oxidation time, and oxygen-containing ambient composition. The decrease in diameter of the nanowire 104 can be controlled to a desired value in this manner.

The nanowires can be formed using any suitable growth technique. For example, the nanowires can be grown from single crystal or non-single crystal surfaces by chemical vapor deposition (CVD) techniques. The nanowires can be grown by catalyzed growth. Nanobridge formation using catalyst growth techniques are described, e.g., by T. Kamins, "Beyond CMOS Electronics: Self-Assembled Nanostructures," The Electrochemical Society *Interface*, Spring 2005; and M. Saif Islam, S. Sharma, T. I. Kamins and R. Stanley Williams, "Ultrahigh-Density Silicon Nanobridges Formed Between Two Vertical Silicon Surfaces," *Nanotechnology* 15, L5-L8 (2004), each of which is incorporated herein by reference in its entirety. In these techniques, nanowires are grown by interaction of a depositing material with a catalyst nanoparticle formed on the surface from which the nanowires are grown. Metal catalyst nanoparticles are formed on a growth surface. The nanoparticles can be formed directly on the growth surface, or the catalyst material can be deposited (e.g., by physical vapor deposition (PVD) or chemical vapor deposition (CVD)) on the growth surface followed by annealing the catalyst material to form the nanoparticle catalyst. Metal catalyst nanoparticles can comprise, for example, Ti, Au, Fe, Co, Ga and alloys thereof. The metal can be selected based on the nanowire composition. The catalyst nanoparticles can be in the liquid or solid phase during nanowire growth.

The nanoparticle catalyst or catalyst material can be deposited preferentially on selected surfaces and/or on portions of selected surfaces. For example, the nanoparticle catalyst or catalyst material can be formed on only a region, or on the entire surface, of a single crystal or non-single crystal surface. Angled deposition of the nanoparticle catalyst or catalyst material can be employed to produce preferential deposition. By using preferential deposition of the nanoparticle catalyst or catalyst material, the starting location for growth of the nanowires on a surface can be controlled.

After forming the nanoparticles on selected surface(s) or surface regions, the material that is used to grow the nanowires (e.g., Si, Ge, Si—Ge alloy or Group III-V material) is transported to the nanoparticles. Atoms of the nanowire material precipitate preferentially between the nanoparticles and the surface, thereby pushing the nanoparticles away from the surface and forming the nanowires. The as-grown nanowires typically have about the same diameter as the catalyst nanoparticles, or larger.

The gas that is used to form the nanowires depends on the desired nanowire composition. For nanowires formed of semiconductor materials other than silicon, the gas contains the precursors for those respective other semiconductor materials. In some embodiments, the surface from which the nanowires are grown is exposed to the gas in a reactor chamber of a deposition system. The process chamber conditions and the process gas are controlled during nanowire growth. The process gas can be a single gas or a gas mixture. For example, silicon nanowires can be grown in a CVD system using a mixture of silane ($SiH_4$) and HCl, or dichlorosilane ($SiH_2Cl_2$), using Au or Ti as the catalyst material, to nucleate the nanowires. The formation of Ge nanowires using Au-catalyzed, epitaxial growth on silicon substrates using a mixture of $GeH_4$ and $H_2$ at growth temperatures of about 320° C. to 380° C., is described by T. I. Kamins, X. Li and R. Stanley Williams, "Growth and Structure of Chemically Vapor Deposited Ge Nanowires on Substrates," *Nano Letters*, Vol. 4, No. 3, pp. 503-06 (2004), which is incorporated herein by reference in its entirety.

One or more portions along the length of the nanowires can be intrinsic material, or doped n-type and/or p-type to control the electronic properties of the nanowires. P-type or n-type dopants can be added conventionally from the gas phase during nanowire growth. For example, phosphorus can be added to the gas using $PH_3$, and boron using $B_2H_6$.

Thermal oxide layers can be formed on the nano-scale structures, such as nanowires or quantum dots, by direct oxidation of the nano-scale structures at elevated temperature in either an oxygen (dry oxidation) or steam or water vapor (wet oxidation) ambient. The oxidation rate can be varied by controlling oxidation temperature and pressure to form a desired oxide thickness on the nano-scale structures. Increasing the oxidation temperature and/or pressure increases the oxidation rate and accordingly reduces the oxidation time needed to form an oxide of a given thickness. High-pressure oxidation can be used to increase the oxide growth rate at a fixed temperature or keep the growth rate constant at a lower temperature. Growing the oxide at a lower temperature and/or for a shorter time reduces thermal exposure of the nanowires. Typically, the oxidation time can range from about 1 minute to about 1 hour, and the oxidation temperature can range from about 200° C. to about 800° C. for oxidizing the semiconductor material.

The thermal oxidation process can be performed in any suitable vessel in which an oxygen-containing ambient can be introduced and the oxidation temperature and other process parameters can be controlled to control thermal oxide growth. In some embodiments, the nano-scale structures can be heated with a local heating source, such as a laser, in an oxygen-containing atmosphere to form the thermal oxide. Local heating with a laser or the like can limit thermal exposure of the nano-scale structures.

During oxidation of silicon oxygen diffuses through the oxide and reacts at the silicon surface. For growing a thermal oxide of thickness, t, about 0.45t of silicon is consumed, and the outer portion of the thermal oxide extends about 0.55t above the original silicon surface. See W. R. Runyan and K. E. Bean, *Semiconductor Integrated Circuit Processing Technology*, Addison-Wesley, pp. 57-8 (1994). The surface(s) on which the nano-scale structures are formed can be protected, such as by dielectric layers, during the thermal oxidation process.

The nanowires can be formed with a substantially constant diameter along their length. For example, the diameter of respective nanowires grown from a surface can vary by less than 5%, such as less than 3%. It is desirable that the respective nanowires have a small diameter variation because this allows closer control of the diameter of the nanowires as a result of the thermal oxidation process. For example, chlorine-containing species can be added in the gas phase to inhibit uncatalyzed nanowire deposition to yield silicon nanowires with uniform diameter along their length, as described in S. Sharma, T. I. Kamins and R. Stanley Williams, "Diameter Control of Ti-Catalyzed Silicon Nanowires," *J. Cryst. Growth*, 267, pp. 613-18 (2004), which is incorporated herein by reference in its entirety. The nanowires can typically have a diameter of about 10 nm to about 100 nm. Larger diameters of the nanowires are generally desirable. The thermal oxide can typically have a thickness of about 5 nm to about 300 nm. The thermal oxidation process can be controlled to control the diameter of the core of the nanowires, which in turn controls the quantum effects of the nanowires.

Referring to FIG. 1B, the diameter, $D_f$, of the core 120 of the nanowire 104 can be monitored, either in-situ (during thermal oxidation) or ex-situ. In an embodiment, a physical property of the nanowire 104 can be measured before forming the passivation layer (i.e., for a nanowire diameter $D_i$), and then either during and/or after forming the passivation layer, to determine the diameter of the nanowire before passivation layer growth, and the diameter of the core either during and/or after passivation layer growth. For example, the resistance, R, of the nanowire 104 can be measured. The resistance is a function of the length, L, and cross-sectional area, A, of the core 120. To measure the resistance, a voltage, V, is applied across the length of the core 120. Before forming the passivation layer 122, an initial current, $I_i$, flows through the nanowire 104 when the voltage, V, is applied across the nanowire. The value of the current, I, is given by: $I = V \cdot A / \rho \cdot L$, where $\rho$ is the resistivity of the material of the nanowire 104.

Another in-situ monitoring technique that can be used is exciting the nanowires with an optical source and measuring the photoluminescence spectrum. As the nanowires become thinner, the spectrum is blue shifted. By correlating the spectrum with the diameter of the nanowires, a look-up table can be generated.

During growth of the passivation layer 122 on the core 120, the cross-sectional area of the core 120 decreases from an initial value, $A_i$, to a final value, $A_f$, which causes the current that flows through the core 120 to decrease from $I_i$ to a final current, $I_f$. Thermally-grown $SiO_2$, e.g., is a very good electrical insulator. Consequently, it can be approximated that the change in the resistance of the nanowire 104 including the passivation layer 122 (and thus also the change in current flowing through the nanowire 104 including the passivation layer 122) is due only to the change in the diameter of the core 104. Assuming that V, $\rho$ and L remain constant during thermal oxidation, the change in cross-sectional area, $\Delta A$, i.e., $\Delta A = A_i - A_f$, can be calculated and then used to determine an approximated value of $D_f$, i.e., $D_f = (D_i^2 - (4\Delta A/\pi))^{1/2}$.

By measuring the diameter of the core 120 of the nanowire 104 under various thermal oxidation processing conditions (e.g., nanowire compositions, oxidation temperatures, oxidation times, pressures, oxygen ambient compositions), the diameter of the core 120 can be related to these parameters and controlled during thermal oxidation to consistently produce nanowires having a desired core diameter. Embodiments of the methods of controlling the nanowire diameter can be used to produce nanowires that have size characteristics that may not be possible to obtain by nanowire growth techniques alone, e.g., a diameter that is smaller than is obtainable by growth techniques.

In another exemplary embodiment, the diameter of nanowires resulting from thermal oxidation can be measured by physical thickness measurements. For example, the nanowire (core) diameter can be measured by oxidizing a series of nanowires for varying periods of time under the same oxidation conditions and then measuring the nanowire (core) diameter resulting from thermal oxidation for the different oxidation periods.

In another exemplary embodiment, the thickness of the passivation layer formed during and/or after thermal oxidation can be measured by monitoring optical emission from the nanowire.

In another exemplary embodiment, thermal oxide layers formed on nanowires can be selectively removed, either partially or completely, from the core of the nanowires. For example, a desired portion of the thickness of the passivation layer can be selectively removed. If the passivation layer is made of a material that has an etching rate much faster than that of the material of the nanowire on which the passivation layer is grown, the passivation layer can be selectively removed from the nanowire substantially without damaging the nanowire. For example, a $SiO_2$ passivation layer formed on a Si nanowire can be removed selectively substantially without damaging the Si nanowire. Exemplary gases and gas mixtures that can be used to selectively plasma etch $SiO_2$ over Si include $CF_4/H_2$, $CHF_3/O_2$, $C_2F_6$, $C_3F_8$.

In an exemplary embodiment, the thermal oxide can be selectively entirely removed from the underlying core of the nanowire to produce a nanowire having a desired final diameter. It is desirable that the passivation layer can be removed from the nanowire substantially without changing the diameter of the nanowire so that the nanowire has approximately the same final diameter (i.e., after removing the passivation layer) as it had when removed from the thermal oxidation process. For example, silicon or silicon-based nanowires without a passivation layer can be used as cantilevers in accelerometers, fast fuses, or other applications where the electronic properties of the nanowires are not important.

Group III-V nanowires can be used, for example, in photodetectors, optical sources and electrical devices without surface passivation. The optical properties of such Group III-V nanowires can be improved, however, by surface passivation.

In another embodiment, the nanowires can be laser ablated or chemically etched to form a hollow tube with a controlled nano-hole. The nano-hole can be sized to any suitable dimensions to be useful for analysis of selected molecules, such as DNA.

Figure 2:
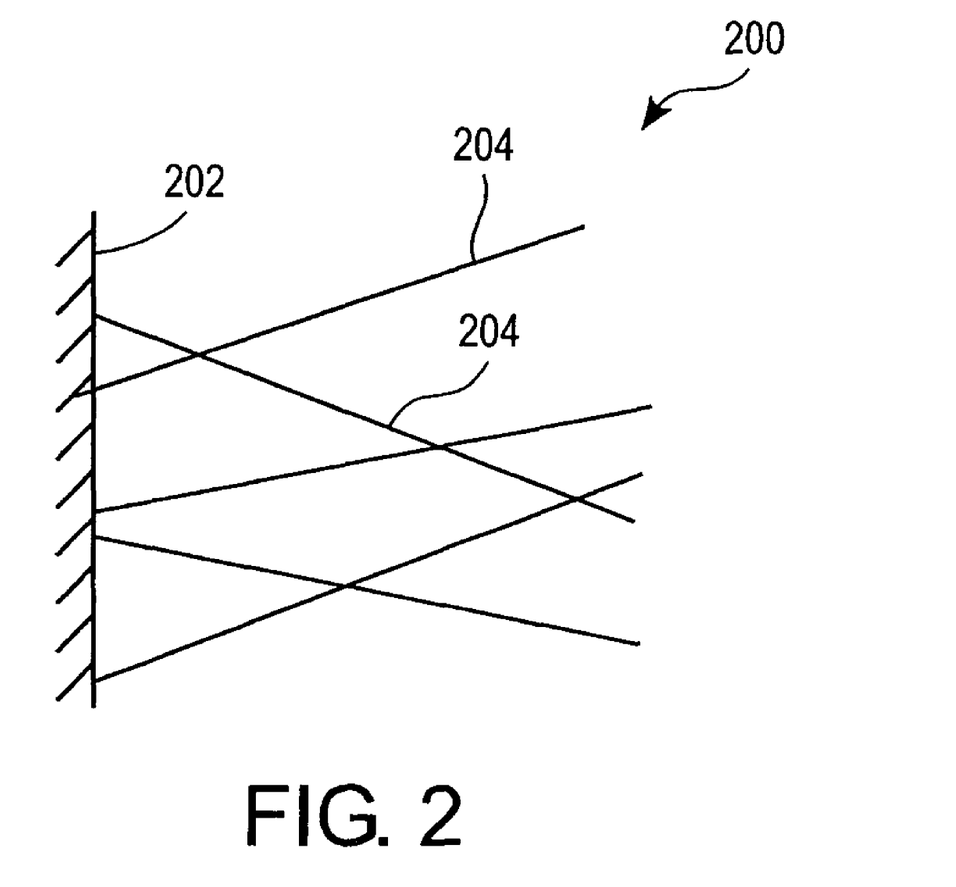
FIG. 2 illustrates an exemplary embodiment of a nanowire structure comprising multiple nanowires randomly grown from a surface.

The nano-scale structures having controlled size can be incorporated in various devices, including, for example, accelerometers, photodetectors and nanowire transistors. FIG. 2 illustrates an exemplary embodiment of a nano-scale structure 200. For example, the illustrated nano-scale structure 200 can be an accelerometer for detecting vibration. The nano-scale structure 200 comprises a surface 202 and nanowires 204 grown from the surface 202. The nanowires 204 have a free end opposite to the end connected to the surface 202. The nanowires 204 can be without a passivation layer. The number of nanowires 204 grown from the surface 202 can range from one to a large number, with a corresponding high nanowire density. In this exemplary embodiment, each of the nanowires 204 is grown in a random direction (in three dimensions) from the surface 202, as shown.

The surface 202 can comprise a single crystal material, or a non-single crystal material that has suitable physical characteristics to enable the growth of one or more of the nanowires 204 on the non-single crystal surface 202. The material of the non-single crystal surface 202 can withstand nanowire growth temperatures, which typically range from about 350° C. to about 700° C. The non-single crystal material can comprise, for example, polycrystalline silicon, amorphous silicon, microcrystalline silicon, and carbon-based inorganic materials, such as diamond and diamond-like carbon. The non-single crystal material that is chosen can depend on the desired characteristics of the non-single crystal surface. These non-single crystal materials are typically inexpensive and, consequently, they can reduce costs of manufacturing the photodetectors, as compared to the use of more-expensive single crystal materials, e.g., single crystal silicon, germanium and like. The single-crystal nanowires 204 exhibit all of the properties of single crystalline semiconductors, but the nano-scale structure 200 can be fabricated with inexpensive materials.

The surface 202 can have any suitable surface orientation and surface contour. The surface 202 can be vertical, as shown. Alternatively, the surface 202 be horizontal or extend at an acute angle to the horizontal, for example. The surface 202 can include portions that have different orientations from each other. For example, the surface 202 can be stepped. The contour of the surface 202 is typically planar, but other contours that allow nanowire growth can alternatively be used.

Figure 3:
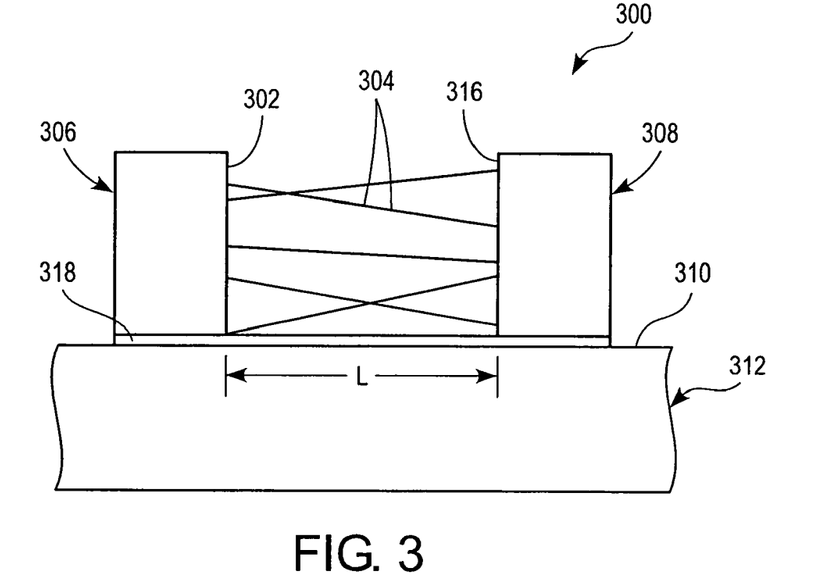
FIG. 3 illustrates another exemplary embodiment of a photodetector comprising multiple nanowires randomly grown from a first surface and connecting to a second surface in a bridging configuration.

A photodetector 300 according to an exemplary embodiment is shown in FIG. 3. The photodetector can be photodiode or photoconductor. The photodetector 300 comprises a first protrusion 306 and an opposing second protrusion 308 on a top surface 310 of a substrate 312. The first protrusion 306 includes a first surface 302 and the second protrusion 308 includes a second surface 316 facing the first surface 302. As shown, the first and second surfaces 302, 316 are vertical surfaces. These surfaces can alternatively be horizontal.

The first surface 302 and the second surface 316 can comprise single crystal or non-single crystal material. For example, the non-single crystal material can be any material that has suitable physical characteristics to enable the growth of nanowires. The non-single crystal material can be, for example, polycrystalline silicon, amorphous silicon, microcrystalline silicon, or carbon-based inorganic materials, such as diamond and diamond-like carbon. The first protrusion 306 and the second protrusion 308 can have any suitable dimensions to provide sufficient surface area for the nanowire growth. For example, the first and second surfaces 302, 316 can have a height of about 10 nm to about 1000 nm, and a width of about 1000 nm to about 10,000 nm (i.e., about 1 µm to about 10 µm. As shown, the first and second surfaces 302, 316 are separated from each other by a distance, L, which can range from about 100 nm to about 10 µm. The nanowires 304 having a selected diameter can be formed with sufficient mechanical strength to extend over the distance L.

In some embodiments, the first protrusion 306 and second protrusion 308 can be electrodes or electrically-isolated circuit elements. In these embodiments, the first protrusion 306 and second protrusion 308 are heavily doped to increase their respective conductivity and are electrically isolated from each other. For example, for a photodiode, the first protrusion 306 can be doped p-type and the second protrusion 308 can be doped n-type, or vice versa. For a photoconductor, the first protrusion 306 and the second protrusion can both be doped p-type or both doped n-type. The first protrusion 306 and second protrusion 308 can both be formed on an electrical insulator 318, such as $SiO_2$, formed on the top surface 310 of the substrate 312. In operation, the photodetector 300 can be reverse biased and each nanowire 304 can absorb electromagnetic energy over a wide wavelength range and convert this energy to electrical current.

The nanowires 304 can have a desired diameter. As described above, the diameter of the nanowires 304 can be controlled during the thermal oxide growth process. The thermal oxide can be partially removed. The number of nanowires 304 grown from the surface 302 can range from one to a large number, with a corresponding high nanowire density, to thereby enhance the capture of electromagnetic waves, e.g., visible light. Random nanowire growth is desirable to enhance light trapping by the nanowires at substantially all angles of incident light. This feature is desirable because the photodetectors do not have to be positioned facing a light source, including the sun, to achieve light conversion. The light comes from above and the nanowires are dense and act as a light trap.

In the embodiment, the substrate 312 comprises a single crystal material or a non-single crystal material. The non-single crystal material can be an electrical conductor or insulator. For example, the substrate 312 can be made of glass, quartz, polymers (e.g., a thermoplastic, such as polyethylene terephthalate (PET)), or metals (e.g., a stainless steel, aluminum and an aluminum alloy). These materials are typically inexpensive and readily available. Consequently, the use of these exemplary materials can reduce costs of manufacturing the photodetectors. Also, in some embodiments, the substrate material can be provided on a roll, allowing multiple photodetectors to be fabricated with a roll manufacturing process. The substrate materials can also be lightweight to reduce device weight.

The substrate 312 can comprise a light-transparent material so that light can be transmitted through the substrate 312 in substantially any direction. In such embodiments, the photodetector 300 can be positioned on a light transparent material, such as a glass or polymeric material. In other embodiments, the substrate material is opaque to visible light. In such embodiments, the photodetector 300 can be positioned on an opaque surface, e.g., a metallic, ceramic or polymeric surface.

In the photodetector 300 shown in FIG. 3, the nanowires 304 can be grown from either one of the surfaces 302, 316. For example, when the nanowires 304 are grown from the first surface 302, the nanowires 304 impinge on, and mechanically and electrically connect to, the second surface 316 of the protrusion 308 to form nanobridges. The ends of the nanowires 304 form a self-assembled nanowire connection between the opposing single crystal or non-single crystal surfaces. In the illustrated embodiment, the nanowires 304 grow laterally from the first surface 302 and impinge on the second surface 316 of the protrusion 308 to form nanobridges.

Figure 4:
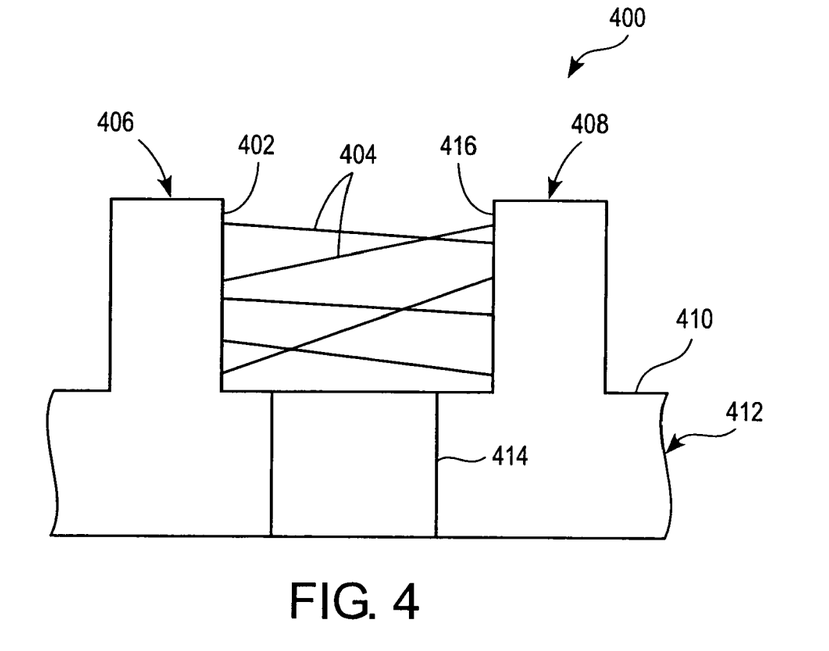
FIG. 4 illustrates another exemplary embodiment of a photodetector comprising nanowires randomly grown from a first surface and connecting to second surface in a bridging configuration, where the first and second surfaces are formed on a substrate of the same material as the first and second surfaces.

A photodetector 400 according to another exemplary embodiment is shown in FIG. 4. The photodetector 400 comprises a first protrusion 406 and an opposing second protrusion 408 on a top surface 410 of a substrate 412. The first protrusion 406 includes a first surface 402, and the second protrusion 408 includes a second surface 416 facing the first surface 402. The nanowires 404 can have a desired diameter, which can be controlled during the thermal oxide growth process. The thermal oxide can be partially removed. In the illustrated embodiment, the nanowires 404 are each randomly oriented.

In the embodiment, the first protrusion 406 and second protrusion 408 are made of the same non-single crystal material as the substrate 410. The non-single crystal material can be selected from polycrystalline silicon, amorphous silicon, microcrystalline silicon, or carbon-based inorganic materials, such as diamond and diamond-like carbon, depending on the desired characteristics of the non-single crystal material.

In some embodiments, the first protrusion 406 and second protrusion 408 are electrodes or electrically-isolated circuit elements. In these embodiments, the first protrusion 406 and second protrusion 408 are heavily doped and are electrically isolated from each other. An electrical insulator region 414 can be formed in the substrate 412 by ion implantation of oxygen to form $SiO_2$, for example. In operation, the photodetector 400 can be reverse biased and each nanowire 404 can absorb electromagnetic energy over a wide wavelength range and convert this energy to electrical current. The insulator region 414 electrically separates the p-type and n-type material of the substrate 412 to enable electrical current to flow through the nanowires 404 without having electrical shortage within the substrate 412.

Figure 5:
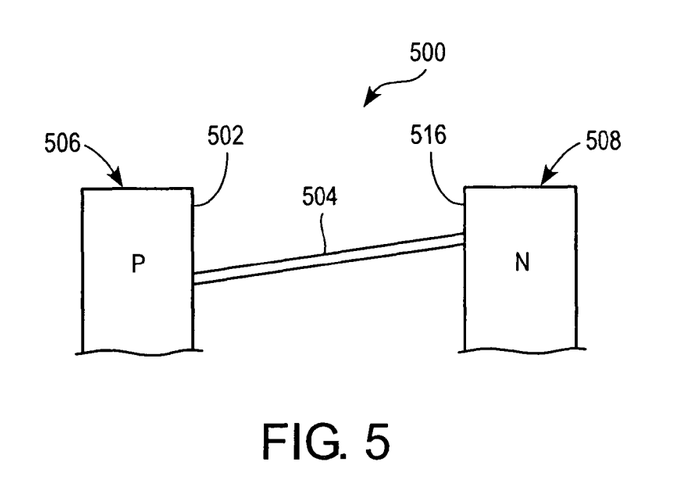
FIG. 5 illustrates another exemplary embodiment of a photodetector comprising a nanowire of a single conductivity type grown from a first surface and connecting to a second surface in a bridging configuration.
Figure 6:
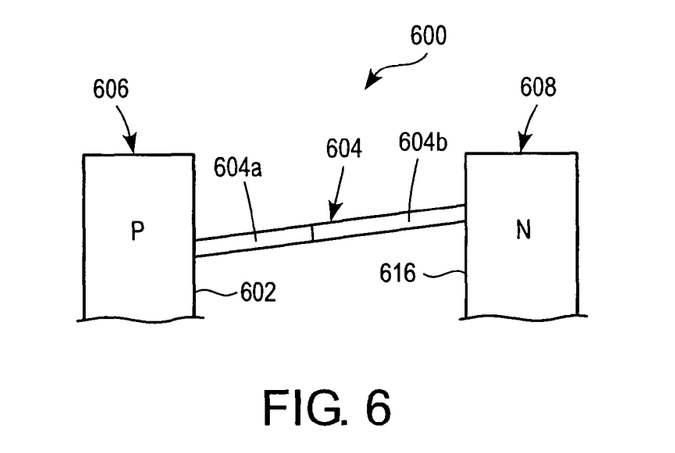
FIG. 6 illustrates another exemplary embodiment of a photodetector comprising a nanowire randomly grown from a first surface and connecting to a second surface in a bridging configuration, where the nanowire comprises two sections of different conductivity types.
Figure 7:
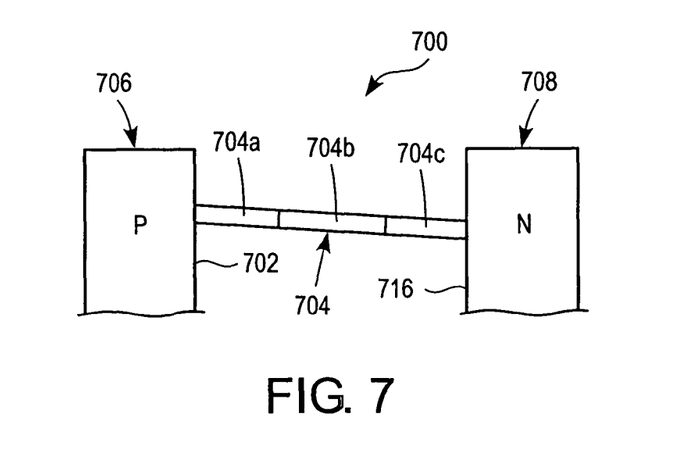
FIG. 7 illustrates another exemplary embodiment of a photodetector comprising a nanowire randomly grown from a first surface and connecting to a second surface in a bridging configuration, where the nanowire comprises three sections of different conductivity types.

FIGS. 5 to 7 depict additional exemplary embodiments of photodetectors that comprise nanowires having different electrical characteristics. In each of FIGS. 5 to 7, for simplicity, a single nanowire having a certain electrical characteristic is shown. However, each of these embodiments can comprise a plurality of nanowires that form nanobridges. The nanowires can have a desired diameter, which can be controlled during the thermal oxide growth process. The thermal oxide can be partially removed.

The exemplary embodiment of the photodetector 500 shown in FIG. 5 comprises a first protrusion 506 including a first surface 502 and a second protrusion 508 including a second surface 516. The surfaces 502, 516 can be single crystal or non-single crystal material. As depicted, the first protrusion 506 and second protrusion 508 can be doped p-type and n-type, respectively. The nanowire 504 comprises intrinsic material (i). The first protrusion 506 and second protrusion 508 can be disposed on an insulator layer formed on a substrate to electrically isolate the p-type and n-type regions.

Other exemplary embodiments of the photodetectors can comprise nanowires including at least one controlled boundary at a given location along the nanowire during growth, such as a heterojunction, to control electronic properties of the nanowire. The exemplary embodiment of the photodetector 600 shown in FIG. 6 comprises a first protrusion 606 including a first surface 602 and a second protrusion 608 including a second surface 616. The surfaces 602, 616 can be single crystal or non-single crystal material. The first protrusion 606 and second protrusion 608 can be disposed on an insulator layer formed on a substrate, for example. In the embodiment, the first protrusion 606 and second protrusion 608 are doped p-type and n-type, respectively. The nanowire 604 comprises a first section 604a comprising intrinsic material or p-type material adjacent the p-type first non-single crystal surface 602, and a second section 604b comprising intrinsic material or n-type material adjacent the n-type second non-single crystal surface 616. In the embodiment, a p-n or p-i-n junction is formed in the nanowire 604, which can assist in forming a strong built-in field in the nanowire 604.

The exemplary embodiment of the photodetector 700 shown in FIG. 7 comprises a first protrusion 706 including a first surface 702 and a second protrusion 708 including a second surface 716. The surfaces 702, 716 can be single crystal or non-single crystal material. The first protrusion 706 and second protrusion 708 can be provided on an insulator layer formed on a substrate, for example. In the embodiment, the first protrusion 706 and second protrusion 708 are doped p-type and n-type, respectively. The nanowire 704 comprises a first section 704a comprising p-type material adjacent the p-type first non-single crystal surface 702, a second section 704b comprising intrinsic material, and a third section 704c comprising n-type material adjacent the n-type second non-single crystal surface 716. In the embodiment, a p-i-n junction is formed in the nanowire 704.

Forming more than one coating layer (e.g., additional layer on top of passivation layer) on the nanowires is desirable in some embodiments of the photodetectors. From an anti-reflection coating aspect, having multiple layers can, in general, cover a wider range of the electromagnetic spectrum. Multiple-layer coating structures of the nanowires can act as an anti-reflection coating. This feature is advantageous for certain applications of the photodetectors, e.g., especially when the nanowires are aligned in an orderly manner. In a less orderly arrangement of the nanowires, the nanowires behave as a light trap in all directions.

Forming a multiple-coating layer structure on the nanowires is also desirable for embodiments of the photodetectors in which the outer surface of the nanowire (i.e., the outermost coating layer surface) is functionalized. For example, different biochemical species can be used to make a biological/chemical sensor. An exemplary multi-layered coating structure that can be formed on nanowires includes a passivation layer formed on the surface of the nanowires (e.g., a thermally-stable $SiO_2$ layer formed on silicon), so that the surface of the nanowire is passivated (and the nanowire can have a desired diameter), and the outer surface of the passivation layer is then coated with a layer having an outer surface that is suitable for biological/chemical functionalization, so that the nanowires provide desired biological/chemical sensing capabilities.

In embodiments, sensing can occur in various ways. For example, trapped molecules can emit light that the photodetector can then detect. In a nanowire transistor, current flow along the nanowires is disrupted by biological and/or chemical species attached to the nanowires.

Figure 8:
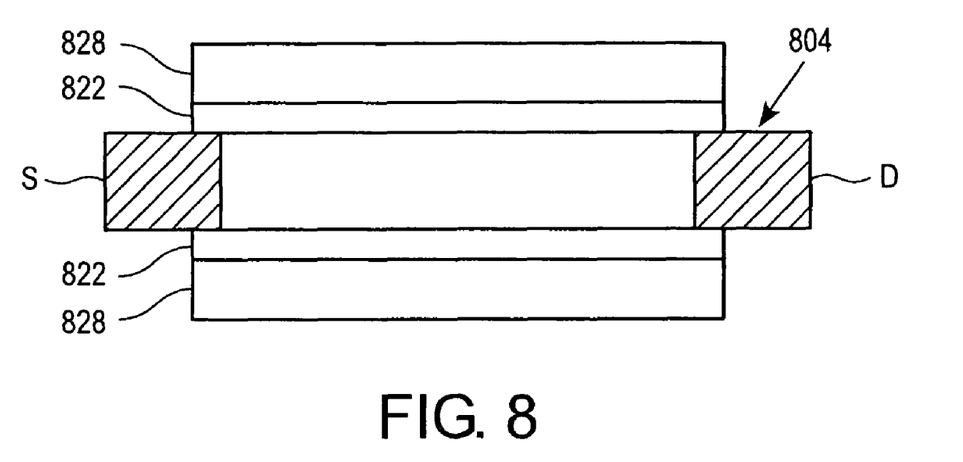
FIG. 8 illustrates an exemplary embodiment of a nanowire field effect transistor (FET).

FIG. 8 illustrates an embodiment of a field effect transistor (FET) formed on a nanowire 804. In the embodiment, a gate insulator 822 is fabricated on the nanowire 804 by a thermal oxide growth process (e.g., a $SiO_2$ layer grown on Si), and a drain, D, and a source, S, are fabricated at locations along the nanowire 804. The nanowire 804 can be doped. An optional selective coating 828 is formed on the gate insulator 822 to allow sensing of species.

In the embodiment shown in FIG. 8, if the nanowire 804 is a nano-straw (nano-tube), as the DNA passes through the nanowire, its capacitance can be measured.

Embodiments of the photodetectors can be formed that are capable of detecting electromagnetic waves having a wavelength range within the range of deep ultra-violet (UV) to terahertz. Size control of nano-scale structures can be used to produce nanowires having a diameter of about 10 nm or less, for example. The small-diameter nanowires will exhibit quantum effects.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method of making a nanowire structure having a controlled size, comprising:
   growing at least one nanowire from a first surface to a second non-single crystal surface in a bridging configuration, the nanowire comprising Si, Ge, a Si—Ge alloy, or a Group III-V material and having a dimension, $D_i$; and
   growing a passivation layer on the nanowire by thermal oxidation, wherein the passivation layer comprises an oxide of the nanowire material and wherein growth of the passivation layer forms a core of the nanowire material having a diameter $D_f$ of less than about 10 nm and a length of at least about 1000 nm;
   wherein the thermal oxidation is controlled to control $D_f$.

2. The method of claim 1, comprising measuring one or more characteristic physical properties of the nanowire to control $D_f$.

3. The method of claim 1, further comprising selectively removing at least a portion of a thickness of the passivation layer from the nanowire.

4. The method of claim 1, further comprising removing at least a portion of the nanowire to form a hollow tube.

5. The method of claim 1, further comprising forming at least one additional layer on the passivation layer.

6. A nanowire structure, comprising:
   a first surface; and
   at least one nanowire grown from the first surface, the nanowire comprising:
     a core comprising Si, Ge, a Si—Ge alloy, or a Group III-V material, the core having a diameter of less than about 10 nm and a length of at least about 1000 nm; and
     a passivation layer formed on the core, the passivation layer comprising an oxide of the core material;
   wherein the nanowire is connected to a second non-single crystal surface in a bridging configuration.

7. The nanowire structure of claim 6, wherein:
   the first surface is a first non-single crystal surface including a material selected from the group consisting of polycrystalline silicon, amorphous silicon, microcrystalline silicon, diamond and diamond-like carbon; and
   the first non-single crystal surface is optionally light transparent.

8. The nanowire structure of claim 6, comprising:
   a first protrusion comprising the first surface which is a first non-single crystal surface; and
   a second protrusion comprising the second non-single crystal surface;
   wherein the first and second protrusions comprise polycrystalline silicon, amorphous silicon or microcrystalline silicon.

9. The nanowire structure of claim 8, wherein:
   the first and second protrusions are formed on a substrate comprising the same material as the first and second protrusions; or
   the first and second protrusions are formed on a substrate comprising a non-single crystal material selected from the group consisting of glass, quartz, polymers and metals.

10. The nanowire structure of claim 8, wherein:
    the first non-single crystal surface comprises p-type material;
    the second non-single crystal surface comprises n-type material; and
    the nanowire comprises one of:
      a) undoped material;
      b) a first section comprising p-type material adjacent the first non-single crystal surface, a second section comprising n-type material adjacent the second non-single crystal surface, and a third section comprising undoped material between the first and second regions;
      c) a first section comprising undoped material adjacent the first non-single crystal surface, and a second section comprising n-type material adjacent the second non-single crystal surface; and
      d) a first section comprising p-type material adjacent the first non-single crystal surface, and a second section comprising undoped material adjacent the first section and the second non-single crystal surface.

11. A method of making the nanowire structure according to claim 6, comprising:
    growing the nanowire from the first surface to the second non-single crystal surface in the bridging configuration; and
    forming the passivation layer on the nanowire.

12. The nanowire structure of claim 6, wherein the nanowire has a hollow tube structure.

* * * * *

UNITED STATES PATENT AND TRADEMARK OFFICE
CERTIFICATE OF CORRECTION

| | |
|---|---|
| PATENT NO. | : 7,906,778 B2 |
| APPLICATION NO. | : 11/730486 |
| DATED | : March 15, 2011 |
| INVENTOR(S) | : Nobuhiko Kobayashi et al. |

It is certified that error appears in the above-identified patent and that said Letters Patent is hereby corrected as shown below:

In column 12, line 8 (Approx.), in Claim 7, after "is" delete "optionally".

Signed and Sealed this
Twenty-ninth Day of November, 2011

David J. Kappos
*Director of the United States Patent and Trademark Office*